(12) United States Patent
Takizawa et al.

(10) Patent No.: US 12,385,125 B2
(45) Date of Patent: Aug. 12, 2025

(54) FILM FORMATION APPARATUS

(71) Applicant: SHIBAURA MECHATRONICS CORPORATION, Yokohama (JP)

(72) Inventors: Yoji Takizawa, Yokohama (JP); Masatoshi Higuchi, Yokohama (JP)

(73) Assignee: SHIBAURA MECHATRONICS CORPORATION, Yokohama (JP)

( * ) Notice: Subject to any disclaimer, the term of this patent is extended or adjusted under 35 U.S.C. 154(b) by 0 days.

(21) Appl. No.: 18/337,764

(22) Filed: Jun. 20, 2023

(65) Prior Publication Data

US 2023/0407458 A1   Dec. 21, 2023

(30) Foreign Application Priority Data

Jun. 20, 2022  (JP) .................................. 2022-099203
May 16, 2023  (JP) .................................. 2023-080995

(51) Int. Cl.

| C23C 14/34 | (2006.01) |
|---|---|
| C23C 14/06 | (2006.01) |
| C23C 14/50 | (2006.01) |
| C23C 14/54 | (2006.01) |
| C23C 14/58 | (2006.01) |

(Continued)

(52) U.S. Cl.
CPC .......... *C23C 14/34* (2013.01); *C23C 14/0641* (2013.01); *C23C 14/50* (2013.01); *C23C 14/505* (2013.01); *C23C 14/541* (2013.01); *C23C 14/586* (2013.01); *H01J 37/32724* (2013.01); *H01J 37/3411* (2013.01)

(58) Field of Classification Search
None
See application file for complete search history.

(56) References Cited

U.S. PATENT DOCUMENTS

| 4,647,361 A | * | 3/1987 | Bauer .................. C23C 14/022 |
|---|---|---|---|
| | | | 438/581 |
| 6,527,866 B1 | * | 3/2003 | Matijasevic .......... C23C 14/087 |
| | | | 438/758 |

(Continued)

FOREIGN PATENT DOCUMENTS

| JP | 2011-97041 A | 5/2011 |
|---|---|---|
| KR | 10-2010-0015932 A | 2/2010 |

(Continued)

*Primary Examiner* — Jason Berman
(74) *Attorney, Agent, or Firm* — Oblon, McClelland, Maier & Neustadt, L.L.P.

(57) ABSTRACT

A film formation apparatus includes: a chamber which an interior thereof can be made vacuum; a rotary table provided inside the chamber, holding a workpiece, and circulating and transporting the workpiece in a circular trajectory; a film formation unit including a target formed of film formation material and a plasma generator which turns sputtering gas introduced between the target and the rotary table into plasma, the film formation unit depositing by sputtering film formation material on the workpiece; a film processing unit processing the film deposited by the film formation unit on the workpiece; holding regions each holding the workpiece and provided in a circular film formation region facing the film formation unit and the film processing unit that is a region other than the rotation axis in the rotary table; and a heater provided in the holding regions.

12 Claims, 6 Drawing Sheets

(51) Int. Cl.
*H01J 37/32* (2006.01)
*H01J 37/34* (2006.01)

(56) References Cited

U.S. PATENT DOCUMENTS

2011/0079507 A1* 4/2011 Kaji ..................... C23C 14/564
  204/192.1
2019/0062904 A1* 2/2019 Hawrylchak ....... C23C 16/0227

FOREIGN PATENT DOCUMENTS

| TW | 202213584 A | 4/2022 |
| TW | 202217029 A | 5/2022 |

* cited by examiner (A)

(B)

FILM FORMATION APPARATUS

CROSS-REFERENCE TO RELATED APPLICATION

This application is based upon and claims the benefit of priority from Japan Patent Application No. 2022-099203, filed on Jun. 20, 2022, and Japan Patent Application No. 2023-080995, filed on May 16, 2023, the entire contents of which are incorporated herein by reference.

FIELD OF INVENTION

The present disclosure relates to a film formation apparatus.

BACKGROUND

Compound semiconductors of nitrided gallium are getting attention as next-generation device material. For example, devices using gallium nitride (GaN) include light emitting devices, power devices, and high-frequency communication devices. Such devices are fabricated by forming compound film of nitrided gallium (GaN film) on silicon (Si) wafers, silicon carbide (SiC) wafers, sapphire substrates, and glass substrates.

Conventionally, the GaN film has been formed by MO-CVD (Metal Organic Chemical Vapor Deposition) method. In the MO-CVD method, since large amount of $NH_3$ gas used in the process is required to suppress evaporation of gallium (Ga) that is liquid under normal temperature and normal pressure and to react Ga with nitrogen (N), the usage efficiency of the material is low. Furthermore, since it is difficult to handle the material gas and it is difficult to keep the condition of the device stable, the yield is low. In addition, since hydrogen (H) contained in the processing gas is captured in the formed GaN film at the time of processing, extra dehydrogenation process is required.

Accordingly, a film formation apparatus is proposed in which sputtering gas and processing gas flow inside a vacuum chamber and target material is deposited and nitrided on a workpiece held in the chamber by sputtering to improve the usage efficiency of the material. In such a film formation apparatus, since reaction gas containing hydrogen (H) is not used, extra processes such as dehydrogenation is not necessary. Furthermore, since only easy-to-handle noble gas is introduced into the chamber, it is easy to maintain the condition of the apparatus stable, which results in excellent yields.

SUMMARY OF INVENTION

Problems to be Solved by Invention

In the film formation apparatus which forms compound film of nitrided gallium (Ga) by sputtering, the film formation needs to be performed while heating to about several hundred degrees to improve the crystallinity of the film during the film formation. For example, the heat source may be fixed and arranged distantly from a rotary table on which a substrate is placed, like Patent Document 1.

However, when heating from a position distant from the rotary table, the workpiece is only mainly heated by radiant heat because the chamber is vacuum. Accordingly, even when said position is close as about 30 mm from the rotary table, the heat must be more than it is originally required. For example, when the workpiece is required to be heated to 600 degrees, the heat must be 1000 degrees, which requires high power heating device and high cost. Therefore, a film formation apparatus with a heat source that can heat the workpiece efficiently when forming film is demanded.

The present disclosure is proposed to address the above-described problem, and the objective is to provide a film formation apparatus which can form film while efficiently heating the workpiece.

Means to Solve the Problem

To achieve the above objective, a film formation apparatus of the present embodiment include:
- a chamber which an interior thereof can be made vacuum;
- a rotary table provided inside the chamber, holding a workpiece, and circulating and transporting the workpiece in a circular trajectory;
- a film formation unit including a target formed of film formation material containing and a plasma generator which turns sputtering gas introduced between the target and the rotary table into plasma, wherein the film formation unit deposits by sputtering particles of the film formation material on the workpiece circulated and transported by the rotary table;
- a film processing unit processing the film deposited on the workpiece in the film formation unit circulated and transported by the rotary table in the film formation unit;
- a plurality of holding regions which holds each workpiece and which is provided in a film formation region that is an annular region in the rotary table other than a rotary shaft facing the film formation unit and the film processing unit; and
- a heater arranged in the plurality of the holding regions.

Effect of Invention

According to the present disclosure, a film formation apparatus that can form film while efficiently heating the workpiece is provided.

EMBODIMENTS

Embodiments of the film formation apparatus are described in detail with the reference to the figures. Note that the figures schematically illustrate each component and each configuration and do not precisely illustrate their dimension and distance.

Summary

Figure 1:
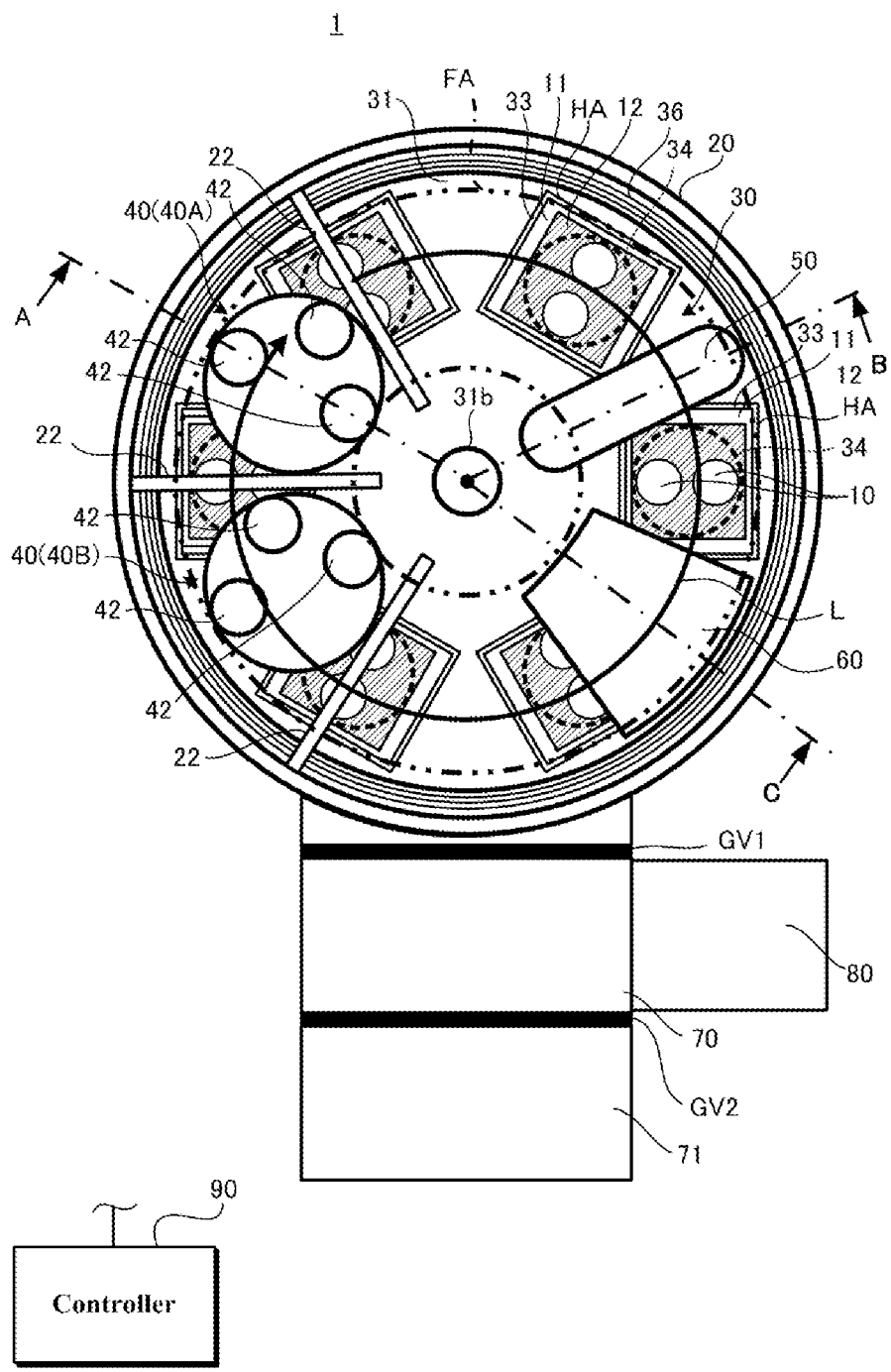
FIG. 1 is a transparent plan view schematically illustrating the configuration of the film formation apparatus according to the embodiment.
Figure 2:
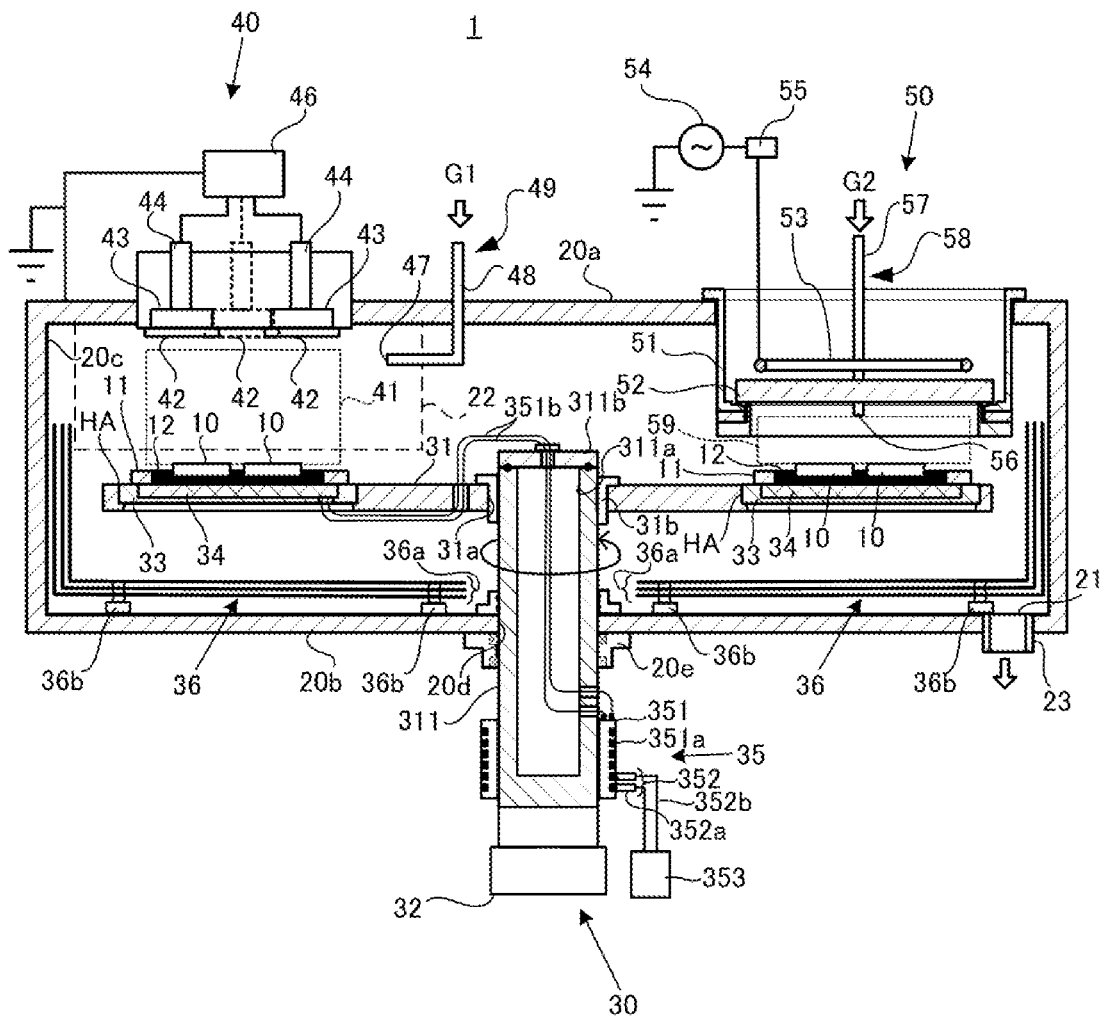
FIG. 2 is an A-B cross sectional diagram of FIG. 1 and is a detailed view of an inner structure of the film formation apparatus viewed from the side.
Figure 3:
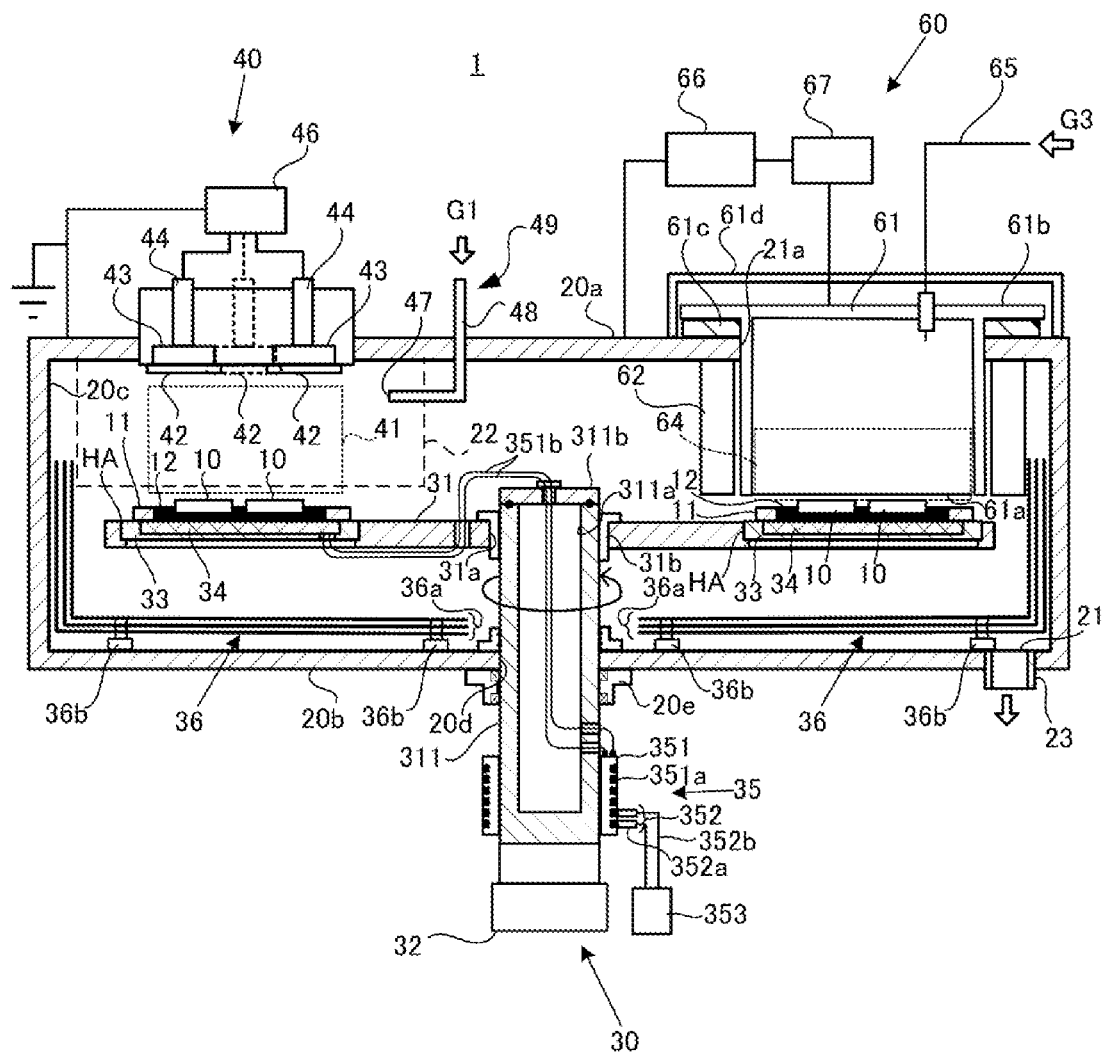
FIG. 3 is an A-C cross sectional diagram of FIG. 1 and is a detailed view of an inner structure of the film formation apparatus viewed from the side.

A film formation apparatus 1 illustrated in FIGS. 1 to 3 is an apparatus for forming GaN (Gallium Nitride) film or AlN (Aluminum Nitride) on a workpiece 10 that is a film formation target by sputtering.

For example, the workpiece 10 that is the film formation target is silicon (Si) wafers, silicon carbide (SiC) wafers, sapphire substrates, and glass substrates.

The film formation apparatus 1 includes a chamber 20, a transporting unit 30, a film formation unit 40, a film processing unit 50, a surface processing unit 60, a transfer chamber 70, a cooling chamber 80, and a controller 90. These are described below.

The film formation apparatus 1 performs each process in the chamber 20 which an interior thereof can be made vacuum can be by the film formation unit 40 to perform film formation process on the workpiece 10, the film processing unit 50 to perform chemical reaction processing on the film formed by the film formation unit 40, and the surface processing unit 60 to process a surface of the workpiece 10 before or after the film formation. Furthermore, the film formation apparatus 1 includes a transfer chamber 70 to carry the workpiece 10 into and out of the chamber 20 and the cooling chamber 80 to cool the workpiece 10 that has been carried out of the chamber 20. These units are controlled by the controller 90.

[Chamber]

As illustrated in FIG. 2, the chamber 20 is a container which can make an interior thereof vacuum. The chamber 20 has a cylindrical-shape and is formed by a disk ceiling 20a, a disk bottom 20b, and an annular inner surface 20c. The interior of the chamber 20 is divided into a plurality of sections by a divider 22. The divider 22 is a square wall plate arranged radially from a center of the cylinder, and extends from the ceiling 20a toward the bottom 20b but does not reach the bottom 20b. That is, a cylindrical space of the chamber 20 is ensured at the bottom-20b side of the chamber 20.

A rotary table 31 to transport the workpiece 10 is arranged in this cylindrical space. A lower end of the divider 22 faces a placement surface for the workpiece 10 in the rotary table 31 with a gap for the workpiece 10 placed on the rotary table 31 to pass through. A processing space 41 for processing the workpiece 10 by the film formation unit 40 is divided by the divider 22. That is, the film formation unit 40 has the processing space 41 that is smaller than the chamber 20. The divider 22 can suppress sputtering gas G1 used in the film formation unit 40 from diffusing in the chamber 20. In the film formation unit 40, since only the pressure in the processing space 41 that is divided and smaller than the chamber 20 needs to be adjusted, pressure adjustment can be easily performed, and plasma discharge can be stabilized.

Note that an exhaustion port 21 is provided in the chamber 20. An exhaustion unit 23 is connected to the exhaustion port 21. The exhaustion unit 23 has piping and unillustrated pumps and valves, and others. The chamber 20 can be depressurized and made vacuum by exhaustion using the exhaustion unit 23 via the exhaustion port 21. In order to suppress the oxygen concentration low, the exhaustion unit 23 exhausts the chamber 20 until degree of vacuum becomes, for example, $10^{-4}$ Pa.

[Transporting Unit]

The transporting unit 30 includes the rotary table 31, a motor 32, a heat insulator 33, a heater 34, a rotary connection 35, and a heat shield 36. The transporting unit 30 is provided inside the chamber 20, holds a plurality of the workpieces 10, and circulates and transports the workpiece 10 along a transporting path L that has the trajectory of a circle. Furthermore, the transporting unit 30 heats the workpiece 10 by the heater 34.

The rotary table 31 is a disk-shape member arranged inside the chamber 20 and expands to a size that does not contact with an inner surface 20c. The rotary table 31 is supported by a cylindrical rotary shaft 311 which is coaxial with an insertion hole 31a provided at the center of the rotary table 31 and which is inserted into the insertion hole 31a via a fastening member 31b. The interior of the rotary shaft 311 is a hollow atmospheric space, and a central hole 311a that is an opened end is covered with a circular plate 311b. Furthermore, the rotary shaft 311 penetrates a through hole 20d provided in the bottom 20b of the chamber 20 to protrudes outside and is fastened to the bottom 20b by a fastening member 20e to make it airtight.

The motor 32 is arranged outside the chamber 20 and continuously rotates the rotary table 31 at the predetermined rotation speed by rotating the rotary shaft 311 via an unillustrated coupling member. For example, the rotary table 31 rotates at speed of 1 to 150 rpm.

The workpiece 10 is placed on a tray 11 and is transported by the rotary table 31. The tray 11 is a plate held by the rotary table 31. The workpiece 10 is placed on the tray 11 via an absorption member 12.

The absorption member 12 is a plate with a depression on an upper surface to place the workpiece 10. The absorption member 12 is fit in the tray 11 so that the upper and lower surface thereof are exposed. The absorption member 12 is a member that absorbs the heat from the heater 34 and improves the heating efficiency of the workpiece 10 by emitting electromagnetic wave with the heat-absorbing wavelength of the workpiece 10. For example, when the workpiece 10 is the sapphire substrate, the absorption member 12 is a member emitting the wavelength between mid-infrared and far-infrared of about 2 µm to 4 µm that is the heat-absorbing wavelength of the sapphire substrate. This value of the heat absorbing wavelength is a value when the workpiece 10 is a sapphire substrate, and when other material is used, the absorption member 12 with the wavelength suitable for said material is employed. The absorption member 12 is a black plate member. For example, the absorption member 12 may be carbon graphite and glassy carbon. The absorption member 12 may be a hard heat-resistant member in which a surface is coated black. Note that the color is not limited to black. That is, coating with the wavelength including the heat-absorbing wavelength of the workpiece 10 may be applied, or the member and coating may have partially different absorbing wavelength to have broader range of heat-absorbing wavelength.

Furthermore, in the present embodiment, since the workpiece that is the heating target is the sapphire substrate which is difficult to heat, the absorption member 12 is used. The absorption member 12 may not be installed if the material of the workpiece 10 itself easily absorbs heat. That is, the absorption member 12 is not necessary if the workpiece 10 can be heated to the desired temperature only by using the heater 34.

As illustrated in FIG. 1, a film formation region FA to form film on a plurality of the workpieces 10 is provided in the rotary table 31. As illustrated in the double-dotted line in FIG. 1, the film formation region FA is a region in the rotary table 31 other than the rotary shaft 311 and is an annular region facing the film formation unit 40 and the film processing unit 50. A holding region HA to hold each workpiece 10 is provided in the film formation region FA at equal intervals in the circumferential direction.

A holder such as grooves, holes, protrusions, fits, or holders is provided in the holding region HA, and holds the tray 11, on which the workpiece 10 is placed, by mechanical chucks or adhesive chucks. For example, a plurality of the workpieces 10 is arranged on the tray 11, and six holding regions HA are arranged on the rotary table 31 at 60 degrees interval. That is, the film formation apparatus 1 can form film on a plurality of the workpieces held on a plurality of the holding regions HA at once, resulting in high productivity. Note that the tray 11 may be omitted and the workpiece 10 may be directly held in the holding region HA of the rotary table 31.

As illustrated in FIG. 2, the heat insulator 33 is a plate formed of heat insulating material and is fit and fixed to the holding region HA. For example, the heat insulator 33 is ceramics. The heater 34 is a heater that generates heat when electricity is conducted. The heater may generate heat by resistance heating or by electromagnetic induction heating. The heater 34 is a circular plate and is fit on the heat insulator 33. By this, the heater 34 is arranged between the rotary table 31 and the workpiece 10 in the holding region HA, and the heat insulator 33 is arranged between the heater 34 and the rotary table 31. The heater 34 should at least have a size in which the workpiece 10 can be arranged on the absorption member 12 or on the tray 11. Therefore, the heater 34 may not necessarily have a size that includes the entire tray 11. The heat insulator 33 and the heater 34 as described above are each arranged in the holding region HA.

An upper surface of the heater 34 is arranged to correspond to the lower part of the absorption member 12 when the workpiece 10 is placed on the holding region HA of the rotary table 31. That is, as illustrated in FIG. 2, the heat insulator 33, the heater 34, the absorption member 12, and the workpiece 10 are arranged to be stacked in this order from the lower side of the rotary table 31.

The heat insulator 33 makes the heat generated from the heater 34 to escape to the rotary table 31 so that damages (such as deformation) to the rotary table 31 can be suppressed. Furthermore, the heat is suppressed from being discharged from lower part of the rotary table 31. Note that the heater 34 heats the workpiece 10 via the absorption member 12 of the tray 11. However, as described above, the absorption member 12 may be omitted, and the workpiece 10 may contact the heater 34. The heater 34 may contact and directly heat the workpiece 10 or may indirectly heat the workpiece 10 via other members.

The rotary connector 35 is a connector for electrically connecting the heater 34 circulated and transported in the trajectory of circle together with the workpiece 10, and a power supply. The rotary connector 35 of the present embodiment is a slip ring having a rotary electrode 351 and a static electrode 352. Note that the rotary connector 35 may be a rotary connector.

In more detail, in the rotary connector 351, a plurality of conductive ring electrodes 351a are arranged coaxially on the rotary shaft 311 outside the chamber 20. Each ring electrode 351a is connected to the heater 34 by a cable 351b (positive wire, negative wire) passing through a hole provided in the rotary shaft 311 and passing through a center of a plate 311b from inside the rotary shaft 311, and rotates together with the rotary shaft 311.

The static electrode 352 is a configuration in which a plurality of conductive brush electrodes 352a are fixed separately from the rotary shaft 311 at a position in contact with each ring electrode 351a. A brush electrode 352a is connected to a controller 353 via a cable 352b and is powered and controlled via the controller 353.

The controller 353 includes a temperature sensor, a temperature adjuster, and an operator. The temperature sensor detects the temperature of the heater 34 and transmits a signal of the detected temperature to the temperature adjuster. The temperature adjuster compares the detected temperature and the predetermined temperature, and transmits an operation signal to the operator. The operator applies or stops applying power to the ring electrode 351a via the brush electrode 352a based on the operation signal to raise or lower the temperature of the heater 34. Accordingly, the controller 353 can control the temperature of the heater 34 by performing feedback control. For example, the temperature sensor may be a thermocouple which is in contact with the heater 34 and which can detect temperature. For example, the operator may be a voltage adjuster such as SCR (Silicon Controlled Rectifier).

Since a part of the brush electrode 352a is pressed to an outer circumference of the ring electrode 351a, a sliding contact is formed. By this, the rotary electrode 351 and the static electrode 352 are conducted, so that the ring electrode 351a and the brush electrode 352a are always maintained in contact to transmit power to the heater 34 even when the rotary electrode 351 rotates together with the rotary shaft 311.

The rotary connection 35 that is the slip ring is provided outside the chamber 20 to avoid vacuum discharge at the sliding contact between the brush electrode 352a and the ring electrode 351a. Furthermore, although omitted in FIG. 2, a pair of the cables 351a and 352b connected to the ring electrode 351a and the brush electrode 352a are provided to each of the heaters 34, so that the temperature of each of the heaters 34 can be controlled individually.

The heat shield 36 is arranged along the film formation region FA distantly from the rotary table 31 at a side opposite the film formation region FA which is facing each processing unit of the rotary table 31. That is, the heat shield 36 is arranged to distantly cover the lower surface of the rotary table 31. The heat shield 36 includes a plurality of heat shielding plates 36a. The heat shielding plate 36a is a metal component with L-shaped cross-section formed by a flat plate that is a horizontal ring-shaped plate and a cylindrical side plate standing straight from an outer edge of the flat plate. Note that a transport port is formed in the cylindrical side plate by cutting out a part thereof corresponding to a load lock 71 to carry in the workpiece 10 to the rotary table 31. The plurality of the heat shielding plates 36a is arranged as stacked layers which are spaced vertically and is supported and fixed to the bottom 20b of the chamber 20 by a support leg 36b. The rotary shaft 311 is inserted with space into the opening at the center of the heat shielding plate 36a.

In such a way, by stacking the plurality of heat shielding plate 36a from a position close to the rotary table 31 toward a direction away from the rotary table 31, the radiant heat from the heater 34 is reduce by stages so that the heat discharge to the bottom 20b of the chamber 20 can be suppressed in a vacuum. Since the heat discharge to the bottom 20b of the chamber 20 is suppressed, damages to the inner wall of the bottom 20b and side surface 20c of the chamber 20, a bearing of the rotary shaft 311, and the like can be prevented. Note that, to suppress the damage due to heat, reflection plates other than the heat shielding plate 36a may be provided to prevent light produced from the heater 34 from hitting the bottom 20b of the chamber 20. To achieve the similar light reflection effect, a surface of the heat shielding plate 36a may be plated with gold.

[Film Formation Unit]

The film formation unit 40 generates plasma and exposes a target 42 formed of film formation material to the plasma. By this, the film formation unit 40 bombards ions contained in the plasma to the target 42 and deposits beaten-out particles (hereinafter, referred to as sputtering particles) forming the target 42 on the workpiece 10 to form the film. The film formation unit 40 includes a plasma generator to turn sputtering gas G1 introduced between the target 42 formed of the film formation material and the rotary table 31 into plasma.

As illustrated in FIG. 2, the plasma generator includes the target 42, a sputtering source formed by a backing plate 43 and an electrode 44, a power supply 46, and a sputtering gas introducer 49.

The target 42 is a tabular component formed of the film formation material that will be the film deposited on the workpiece 10. The target 42 is provided distantly from the transporting path L of the workpiece 10 placed on the rotary table 31. A surface of the target 42 is held on a ceiling 20a of the chamber 20 to face the workpiece 10 placed on the rotary table 31. For example, three targets 42 are installed. Three targets 42 are provided in at positions that are apexes of a triangle in a plan view.

The backing plate 43 is a supporting component to hold the target 42. The backing plates 43 hold each target 42 separately. The electrode 44 is a conductive component for separately applying electric power to each target 42 from outside the chamber 20 and is electrically connected to the target 42. The electrical power applied to each target 42 may be separately modified. If necessary, magnets, cooling mechanism, and the like may be provided to the sputtering source as appropriate.

The power supply 46 is, for example, DC power supply that applies high voltage and is electrically connected to the electrode 44. The power supply 46 applies electric power to the target 42 via the electrode 44. Note that the rotary table 31 is at the same potential as the grounded chamber 20, and the potential difference is produced by applying high voltage to the target-42 side.

As illustrated in FIG. 2, the sputtering gas introducer 49 introduces sputtering gas G1 into the chamber 20. The sputtering gas introducer 49 includes an unillustrated source for the sputtering gas G1 such as a cylinder, piping 48, and a gas inlet 47. The piping 48 is connected to the source for the sputtering gas G1, air-tightly penetrates the chamber 20, and extends into an interior of the chamber 20, and an end thereof opens as the gas inlet 47. The sputtering gas introducer 49 of the present embodiment introduces the sputtering gas G1 into the processing space 41 so that pressure in the processing space 41 becomes 0.3 Pa to 1.0 Pa.

The gas inlet 47 opens between the rotary table 31 and the target 42 and introduces the sputtering gas G1 for film formation into the processing space 41 formed between the rotary table 31 and the target 42. Noble gas is employed for the sputtering gas G1, and argon gas and the like are suitable. The sputtering gas G1 is gas not containing nitrogen (N) and may be single gas of Argon (Ar).

In the film formation processing unit 40, when the sputtering gas G1 is introduced from the sputtering gas introducer 49 and high voltage is applied to the target 42 by the power supply 46 via the electrode 44, the sputtering gas G1 introduced in the processing space 41 formed between the rotary table 31 and the target 42 becomes plasma, and active species such as ions is produced. The ions in the plasma bombards the target 42 and beat out sputtering particles.

Furthermore, the workpiece 10 circulated and transported by the rotary table 31 passes through the processing space 41. The beaten-out sputtering particles are deposited on the workpiece 10 when the workpiece 10 passes through the processing space 41, and film formed of the sputtering particles is formed on the workpiece 10. The workpiece 10 is circulated and transported by the rotary table 31 and repeatedly passes through the processing space 41, to perform the film formation process. The thickness of the film deposited when the workpiece passes through film formation unit 40 once depends on the processing rate of the film processing unit 50, and is, for example, may be thin as about 1 to 2 atomic level (5 nm or less). By circulating and transporting the workpiece for multiple times, the film thickens and the film with the predetermined thickness is formed on the workpiece 10.

In the present embodiment, the film formation apparatus 1 includes a plurality of the film formation units 40 (herein, two film formation unit 40), and in the chamber 20, the film formation unit 40 is divided into two sections by the divider 22. The plurality of the film formation units 40 selectively deposits the film formation material to form film formed of layers of a plurality of the film formation material. In particular, the present embodiment includes the sputtering source corresponding to different types of film formation material, and the plurality of the film formation units 40 selectively deposits the film formation material to form film formed of layers of multiple types of the film formation material. Including the sputtering source corresponding to different types of film formation material may include a case in which all film formation units 40 utilize different film formation material, and a case in which some film formation units 40 utilize the same film formation material while other film formation units 40 utilize the different film formation material. Selectively depositing the film formation material of one type means that when any one type of the film formation material is deposited by the film formation unit 40, other film formation material is not deposited by the film formation unit 40.

In the present embodiment, the film formation material forming the target 42 in one film formation unit 40 is material containing Ga and GaN, and the target 42 is a source for the sputtering gas containing Ga atoms to be deposited on the workpiece 10. The target 42 contains GaN and deficient GaN that lacks nitrogen, that is, Ga atom that lacks bonding with N (nitrogen).

The film formation material forming the target 42 in the other film formation processing unit 40 is material containing Al, and the target 42 is a source for the sputtering gas containing Al atoms to be deposited on the workpiece 10. Note that the target 42 for sputtering may contain atoms other than Ga, Al, and N (nitrogen) if it can supply sputtering particles containing Ga atoms and sputtering particles containing Al atoms.

To distinguish the two film formation units 40, the film formation unit 40 having the target 42 formed of the material containing Ga and GaN is referred to as the film formation unit 40A (GaN film formation unit), and the film formation unit 40 having the target 42 formed of the material containing Al is referred to as the film formation unit 40B (Al film formation unit).

[Film Processing Unit]

The film processing unit 50 generates inductively coupled plasma inside a processing space 59 into which processing gas G2 was introduced, and chemically reacts chemical species in said plasma and the film deposited on the workpiece 10 by the film formation unit 40, to produce compound film. The film processing unit 50 is arranged in sections other than the sections in which the film formation processing unit 40 is arranged inside the chamber 20.

For example, the introduced processing gas G2 includes oxygen or nitrogen. The processing gas G2 may include inert gas such as argon gas, other than oxygen gas and nitrogen gas. The processing gas G2 in the present embodiment is gas containing nitrogen. In the present embodiment, the film processing unit 50 is a nitriding processing unit that generates inductively coupled plasma inside the processing space 59 into which the processing gas G2 containing nitrogen gas was introduced, and chemically reacts chemical species in said plasma and the film deposited on the workpiece 10 by the film formation unit 40, to produce nitride film.

As illustrated in FIG. 2, the film processing unit 50 includes a cylinder body 51, a window 52, an antenna 53, a RF power supply 54, a matching box 55, and a plasma generator formed by a processing gas introducer 58.

The cylinder body 51 is a component that covers the surrounding of the processing space 59. As illustrated in FIGS. 1 and 2, the cylinder body 51 is a cylinder with rectangular horizontal cross-section and rounded corners, and has an opening. The cylinder body 51 is fit in the ceiling 20a of the chamber 20 so that the opening thereof faces the rotary-table-31 side with distance, and protrudes into the interior space of the chamber 20. The cylinder body 51 is formed of material as same as the rotary table 31.

The cylinder body 51 divides the processing space 59 where the nitriding process is performed by the film processing unity 50, so that the diffusion of the processing gas G2 inside the chamber 20 is suppressed. That is, the film processing unit 50 has the processing space 59 that is smaller than the chamber 20 and is apart from the processing space 41. Since only the pressure in the processing space 59 that is divided and smaller than the chamber 20 needs to be adjusted, pressure adjustment can be easily performed, and plasma discharge can be stabilized.

The window 52 is a flat plate of dielectric material such as quartz with a shape that is substantially the same as the horizontal cross-section of the cylinder body 51. The window 52 is provided to block the opening of the cylinder body 51 and divides the processing space 59 in the chamber 20 into which the processing gas G2 containing nitrogen gas is introduced and the interior of the cylinder body 51. Note that the window 52 may be dielectric such as alumina or semiconductors such as silicon.

The processing space 59 is formed between the rotary table 31 and the interior of the cylinder body 51 in the film processing unit 50. The workpiece 10 is circulated and transported by the rotary table 31 and repeatedly passes through the processing space 59 to perform the nitriding process.

The antenna 53 is a conductor wound in a coil-shape, is arranged in the interior space of the cylinder body 51 which is separated from the processing space 59 in the chamber 20 by the window 52, and generates electric field when AC current is applied. To efficiently introduce the electric field generated from the antenna 53 to the processing space 59 via the window 52, it is desirable to arrange the antenna 53 near the window 52. The RF power supply 54 to apply high-frequency voltage is connected to the antenna 53. The matching box 55 that is a matching circuit is connected in series to the output side of the RF power supply 54. The matching box 55 stabilizes plasma discharge by matching impedance at the input side and the output side.

As illustrated in FIG. 2, the processing gas introducer 58 introduces the processing gas G2 into the processing space 59. The processing gas introducer 58 includes an unillustrated source for the processing gas G2 such as a cylinder, piping 57, and a gas inlet 56. The piping 57 is connected to the source for the processing gas G2, air-tightly seals and penetrates the chamber 20, and extends into the interior of the chamber 20, and an end thereof opens as the gas inlet 56.

The gas inlet 56 opens at the processing space 59 between the window 52 and the rotary table 31, and introduces the processing gas G2.

In the film processing unit 50, high-frequency voltage is applied to the antenna 53 from the RF power supply 54. By this, high-frequency current flows in the antenna 53 and electric field by electromagnetic induction is generated. The electric field is generated at the processing space 59 via the window 52, and inductively coupled plasma is generated in the processing gas G2. At this time, chemical species of nitrogen containing nitrogen atoms is produced, and the species bombards the film on the workpiece 10 and bonds with atoms forming the film. As a result, the film on the workpiece 10 is nitrided, and nitride film is formed as the compound film.

Note that the reason for further providing the film processing unit 50 for nitriding while using the material containing GaN as the target 42 in the film formation unit 40A is as follows. That is, since the melting point of Ga is low and Ga is in liquid state under normal temperature and normal pressure, nitrogen (N) may be contained to make the solid target 42. Accordingly, it is considered to simply increase the nitrogen content of the target 42 and form the film only by the sputtering of the target 42.

Here, DC discharge sputtering is preferred than RF discharge sputtering to improve the film formation rate. However, when a large amount of nitrogen is contained in the target 42, a surface thereof becomes insulated. DC discharge may not be produced in the target 42 with such an insulated surface.

That is, there is a limit for the nitrogen content in the GaN target 42, making the nitriding of Ga in the target 42 insufficient. That is, Ga atoms which do not bond with N (nitrogen) atoms are contained in the target 42 containing GaN.

If the nitrogen content in the formed GaN film is low and there is nitrogen defect, the crystallinity and flatness of the film become worse, and therefore lacking nitrogen needs to be supplemented. Therefore, it is considered to add nitrogen gas to the sputtering gas G1 introduced into the film formation unit 40 and perform sputtering, however, there is a concern that the surface of the target 42 may be nitrided and insulated. Therefore, nitrogen gas cannot be added to the sputtering gas G1 in sufficient amount in the GaN film formation unit 40A to supplement lacking nitrogen.

Therefore, to supplement the lack of nitrogen, the nitriding is further performed on the GaN film formed in the film processing unit 50 after the film formation in the film formation unit 40A. As a result of such nitriding process at the time of the film formation, the nitrogen content of the film on the workpiece 10 is increased, and GaN film without nitrogen deficiency can be obtained.

[Surface Processing Unit]

The surface processing unit 60 processes the surface of the workpiece 10 and the film deposited by the film formation unit 40 circulated and transported by the rotary table 31. The processing performed by the surface processing unit 60 is removal of oxide film on the surface of the workpiece 10 before the film is deposited by the film formation unit 40, or flattening of the surface of the film during the formation on the workpiece 10.

The film during the formation on the workpiece 10 is film formed on the workpiece 10 before it becomes the desired thickness, and in detail, is compound film on the workpiece 10 to which the processing by the film processing unit 50 was performed or is film on the workpiece 10 formed by the film formation unit 40. In other words, the transporting unit 30 circulates and transports the workpiece 10 to pass through the film formation unit 40, the film processing unit 50, and the surface processing unit 60. By this, the surface processing unit 60 irradiates ions on the compound film on the workpiece 10 to which the processing by the film processing unit 50 was performed. Otherwise, when the film formation unit 40, the surface processing unit 60, and the film processing unit 50 are arranged in this order in the transporting direction of the transporting unit 30, the transporting unit 30 circulates and transports the workpiece 10 to pass through the film formation unit 40, the surface processing unit 60, and the film processing unit 50 so that the surface processing unit 60 can irradiates ions on the film in the workpiece 10 formed by the film formation unit 40.

The surface processing unit 60 is arranged in sections other than the sections in which the film formation unit 40 and the film processing unit 50 are arranged inside the chamber 20. The surface processing unit 60 includes a cylindrical electrode 61, a shield 62, and a plasma generator formed by a processing gas introducer 65 and a RF power supply 66.

As illustrated in FIGS. 1 and 3, the surface processing unit 60 includes the box-shaped cylindrical electrode 61 provide across the upper portion to the interior of the chamber 20. Although the shape of the cylindrical electrode 61 is not limited, in the present embodiment, the cylindrical electrode 61 is substantially arc-shaped in plan view. The cylindrical electrode 61 has an opening 61*a* in the bottom. An outer edge of the opening 61*a*, that is, a lower end of the cylindrical electrode 61 faces the upper surface of the workpiece 10 on the rotary table 31 via a slight gap therebetween.

The cylindrical electrode 61 has a square cylinder in which one end has the opening 61*a* and the other end is blocked. The cylindrical electrode 61 is attached to the opening 21*a* provided in the ceiling of the chamber via an insulation member 61*c* so that the one end with the opening 61*a* faces the rotary table 31. A side wall of the cylindrical electrode 61 extends inside the chamber 20.

In the cylindrical electrode 61, a flange 61*b* extending outward is provided at the other side of the opening 61*a*. The insulation member 61*c* is fixed between the flange 61*b* and the circumferential edge of the opening 21*a* of the chamber 20 to keep the interior of the chamber 20 airtight. The material of the insulation member 61*c* is not limited if the material is insulative, and for example, may be formed of material such as PTFE (polytetrafluoroethylene).

The opening 61*a* of the cylindrical electrode 61 is arranged at a position facing the transporting path L of the rotary table 31. The rotary table 31 transports the tray 11 on which the workpiece 10 is loaded to pass through the position facing the opening 61*a* as the transporting unit 30. Note that the opening 61*a* of the cylindrical electrode 61 is larger than the size of the tray 11 in the radial direction of the rotary table 31.

As described above, the cylindrical electrode 61 penetrates the opening 21*a* of the chamber 20 and a part of the cylindrical electrode 61 is exposed outside the chamber 20. As illustrated in FIG. 3, the portion of the cylindrical electrode 61 exposed outside the chamber 20 is covered by a housing 61*d*. The inner space of the chamber 20 is maintained airtight by the housing 61*d*. A portion of the cylindrical electrode 61 located inside the chamber 20, that is, around the side wall is covered by the shield 62.

The shield 62 is a fan-shaped square cylinder coaxial with the cylindrical electrode 61 and is larger than the cylindrical electrode 61. The shield 62 is connected to the chamber 20. In detail, the shield 62 stands upward from the edge of the opening 21*a* of the chamber 20, and an end of the shield 62 extending inside the chamber 20 is positioned at the same height as the opening 61*a* of the cylindrical electrode 61. The shield 62 is preferably formed by conductive metal component with low electrical resistance because the shield 62 acts as a cathode like the chamber 20. The shield 62 and the chamber 20 may be integrally formed, or the shield 62 may be attached to the chamber 20 using fixtures and the like.

The shield 62 is provided to stably generate plasma inside the cylindrical electrode 61. Each wall of the shield 62 is provided to extend substantially in parallel with each wall of the cylindrical electrode 62 via a slight gap. It is preferable that the gap is as small as possible, because when the gap is too large, the capacitance may become small or the plasma generated inside the cylindrical electrode 61 may enter the gap. However, if the gap is too small, the capacitance between the cylindrical electrode 61 and the shield 62 becomes large, which is not preferred. The size of the gap may be set as appropriate in accordance with the capacitance required to generate plasma. Note that, although two side walls extending in the radial direction of the shield 62 and the cylindrical electrode 61 are illustrated, the gap with the same size as the gap for the side walls in the radial direction is also provided between two side walls extending in the circumferential direction of the shield 62 and the cylindrical electrode 61.

Furthermore, the processing gas introducer 65 is connected to the cylindrical electrode 61. The processing gas introducer 65 includes an unillustrated source for the processing gas G3, a pump, and a valve, other than piping. The processing gas introducer 65 introduces the processing gas G3 into the cylindrical electrode 61. The processing gas G3 may be changed depending on the purpose of the processing as appropriate. For example, the processing gas G3 may include inert gas such as argon gas, oxygen gas or nitrogen gas, or oxygen gas or nitrogen gas in addition to argon gas.

The RF power supply 66 to apply high-frequency voltage is connected to the cylindrical electrode 61. The matching box 67 that is a matching circuit is connected in series to the output side of the RF power supply 66. The RF power supply 66 is also connected to the chamber 20. When voltage is applied from the RF power supply 66, the cylindrical electrode 61 acts as an anode, and the chamber 20, the shield 62, the rotary table 31, and the tray 11 act as a cathode. That is, they act as electrodes for reverse-sputtering. Therefore, as described above, the rotary table 31 and the tray 11 are conductive and contact with each other to be electrically connected.

The matching box 67 stabilizes plasma discharge by matching impedance at the input side and the output side. Note that the chamber 20 and the rotary table 31 are grounded. The shield 62 connected to the chamber 20 is also grounded. The RF power supply 66 and the processing gas introducer 65 are both connected to the cylindrical electrode 61 via a through hole provided in the housing 61*d*.

When the processing gas G3 that is argon gas is introduced into the cylindrical electrode 61 from the processing gas introducer 65 and high-frequency voltage is applied to the cylindrical electrode 61 from the RF power supply 66, capacitively coupled plasma is generated and argon gas is made into plasma, generating electrons, ions, radicals, and the like. The ions in the generated plasma is irradiated to the film on the workpiece 10 during formation.

That is, the surface processing unit 60 includes the cylindrical electrode 61 in which the opening 61a is provided in one end and to which the processing gas G3 is introduced the inside, and the RF power supply 66 to apply high-frequency voltage to the cylindrical electrode 61, in which the transporting unit 30 transports the workpiece 10 to pass through right below the opening 61a, and the ions are drawn on the film formed on the workpiece and the ion irradiation is performed. In the surface processing unit 60, to draw the ions on the film formed on the workpiece 10, negative bias voltage is applied to the tray 11 on which the workpiece 10 is placed and the rotary table 31.

By using the cylindrical electrode 61 like in the surface processing unit 60, the desired negative bias voltage can be applied to the tray 11 on which the workpiece 10 is placed and the rotary table 31 while keeping said components at earth potential without applying high-frequency voltage on the tray 11 and the rotary table 13, to draw the ions on the formed film. By this, there is no need to add structures for applying high-frequency voltage on the tray 11 and the rotary table 31 or to consider the ratio between the surface area of the electrode that is the anode and the surface area of other components surrounding the electrode that is the cathode for obtaining desired bias voltage, facilitating the apparatus design.

Therefore, to flatten the film on the workpiece during formation, it is possible to draw the ions on the film formed on the workpiece 10 by simple structures even when the film formation and the ion irradiation are repeatedly performed while moving the workpiece 10.

The processing space 64 for surface processing by the surface processing unit 60 is divided by the cylindrical electrode 61 in the chamber 20. The cylindrical electrode 61 can suppress the processing gas G3 from diffusing in the chamber 20. That is, the surface processing unit 60 has the processing space 64 that is smaller than the chamber 20 and is apart from the processing spaces 41 and 59. Since only the pressure in the processing space 64 that is divided and smaller than the chamber 20 needs to be adjusted, pressure adjustment can be easily performed, and plasma discharge can be stabilized. Note that the number and order of the above film formation unit 40, the film processing unit 50, and the surface processing unit 60 are not particularly limited. Said number and order are not limited if desired process can be performed on the circulated and transported workpiece 10.

In this way, the film processing unit 50 turns nitrogen gas into plasma to produce the chemical species containing nitrogen atoms and chemically reacts the chemical species and the film formed on the workpiece 10 to produce the compound film. The film processing unit 50 can utilize inductively coupled plasma with high plasma density to chemically react the chemical species in said plasma and the film deposited on the workpiece 10 by the film formation unit 40, to produce the compound film.

The surface processing unit 60 applies negative bias voltage on the tray 11 on which the workpiece 10 is placed and the rotary table 31 and draws the ions on the film formed on the workpiece 10, to flatten the film. The surface processing unit 60 can utilize the cylindrical electrode 61 to easily draw the ions on the film formed on the workpiece 10 to flatten the film.

[Transfer Chamber]

The transfer chamber 70 is a container for carrying the workpiece 10 in and out the chamber 20 via gate valves GV1 and GV2. As illustrated in FIG. 1, the transfer chamber 70 includes an interior space to house the workpiece 10 before it is carried into the chamber 20. The transfer chamber 70 is connected to the chamber 20 via the gate valve GV1. Although not illustrated, transporting means to carry a tray 11 on which the workpiece 10 is loaded in and out the chamber 20 is provided in the interior space of the transfer chamber 70. The transfer chamber 70 is depressurized by an unillustrated exhaustion mean such as a vacuum pump, and carries in the tray 11 on which the unprocessed workpiece 10 is loaded into the chamber 20 and carries out the tray 11 on which the processed workpiece 10 is loaded from the chamber 20 by the transporting means while keeping the vacuum condition in the chamber 20.

The transfer chamber 70 is connected to a load lock 71 via the gate valve GV2. The load lock 71 is a device to carry in the tray 11 on which unprocessed workpiece 10 is loaded into the chamber 20 from outside and carries out the tray 11 on which processed workpiece 10 is loaded from the transfer chamber 70 by the unillustrated transporting mean while keeping a vacuum condition in the transfer chamber 70. Note that, in the load lock 71, the vacuum condition which is depressurized by the unillustrated exhaustion mean such as a vacuum pump and the air-open condition in which vacuum is broken are switched.

[Cooling Chamber]

The cooling chamber 80 cools the workpiece 10 carried out from the chamber 20. The cooling chamber 80 includes a container connected to the transfer chamber 70 and a cooling mean to cool the workpiece 10 loaded on the tray 11 carried out from the transfer chamber 70. For example, the cooling mean may be a spray to spray cooling gas. For example, the cooling gas may be Ar gas from the source of the sputtering gas G1. If the workpiece 10 of high temperature is carried out to the atmosphere, oxide film is formed on the workpiece 10. Since this oxide film is unnecessary, if this oxide film is formed, it has to be removed. To avoid increasing this process, the cooling chamber 80 is provided to lower the temperature of the workpiece 10 to temperature which the oxide film will not be formed on the surface of the workpiece 10 in the atmosphere. It is preferable that cooling temperature may be temperature in which the oxide film will not be formed, such as 100 degrees or less, and preferably 80 degrees or less. Note that the tray 11 loading the processed workpiece 10 in the transfer chamber 70 is carried into the cooling chamber 80 by an unillustrated transporting mean.

[Controller]

The controller 90 controls various components of the film formation apparatus 1, such as the exhaustion unit 23, the sputtering gas introducer 49, the processing gas introducers 58 and 65, the power supply 46, the RF power supplies 54 and 66, the motor 32, the controller 353, the transfer chamber 70, the load lock 71, and the cooling chamber 80. The controller 90 is a processing device including PLC (Programmable Logic Controller) and CPU (Central Processing Unit) and stores programs describing control contents.

Detailed control contents may be initial exhaustion pressure of the film formation apparatus 1, power applied to the target 42, the antenna 53, and the cylindrical electrode 61, flow amount of the sputtering gas G1 and the processing gas G2 and G3, introduction time and exhaustion time, film formation time, surface processing time, heating temperature and time of the heater 34, rotation speed of the motor 32, cooling temperature, and cooling time. By this, the controller 90 can perform wide variety of film formation specification.

Note that the controller 90 controls the heating temperature of the heater 34 via the controller 353. The heating temperature of the heater 34 is controlled so that the temperature of the workpiece 10 rises by stages to the target temperature. That is, the heater 34 can control the temperature so that the temperature of the workpiece 10 rises by stages. "By stages" means "gradually", "gently", and "not rapidly", and means that the time for the temperature to rise to the target temperature from the start of heating is time that can prevent the workpiece 10 from damaging. Furthermore, the controller 90 can control the heating temperature of the heater 34 depending on the types of the workpiece 10. The heating temperature of a plurality of the heaters 34 can be controlled separately. By this, different types of workpieces 10, such as sapphire substrates and silicon wafers, can be placed on the rotary table 31 and can be processed simultaneously.

[Action]

Figure 4:
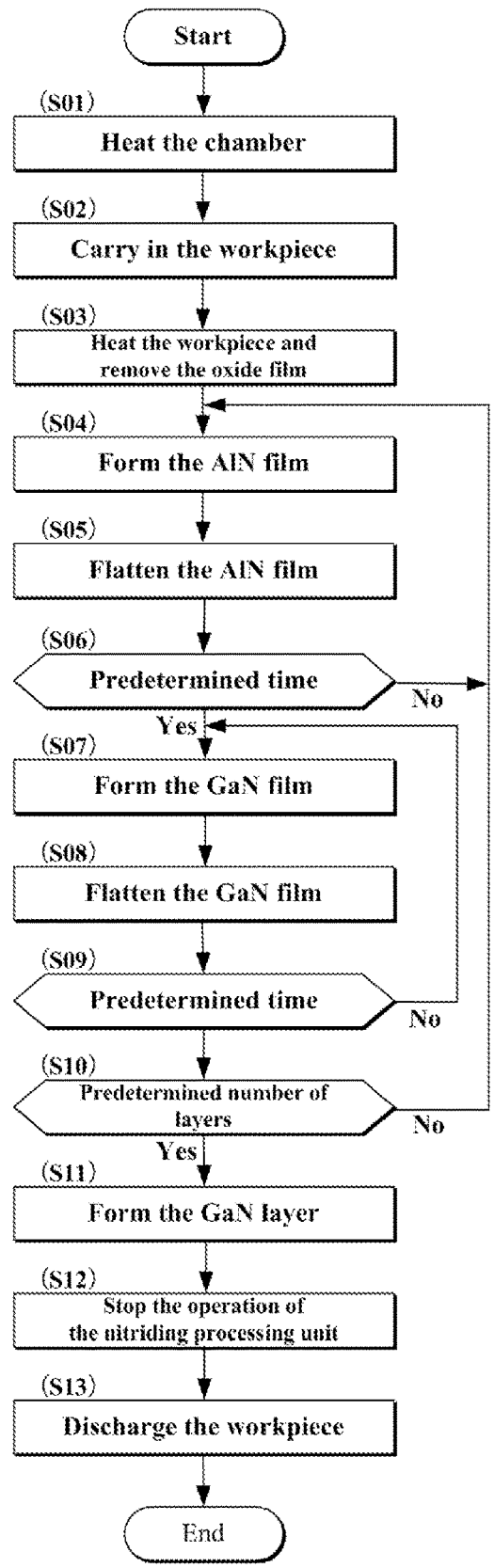
FIG. 4 is a flowchart of processes of the film formation apparatus according to the embodiment.

Next, action of the film formation apparatus 1 controlled by the controller 90 will be described. Note that, as described below, the film formation method to form film by the film formation apparatus 1 is also an aspect of the present disclosure. FIG. 4 is a flowchart of film formation processes by the film formation apparatus 1 according to the present embodiment. The film formation process is a process to alternately form layers of AlN film and GaN film, and to further form GaN layer. Since silicon wafers and sapphire substrates have crystal lattice different from GaN, there is a problem that if GaN film is directly formed, the crystallinity of GaN decreases. To address this mismatch of crystal lattice, layers of AlN film and GaN film are alternately deposited to form a buffer layer, and the GaN layer is formed on the buffer layer. For example, in the manufacturing of lateral MOSFET or LED, the film formation apparatus 1 can be used to form the buffer layer and the GaN layer on the silicon wafer.

For example, FIG. 5(A) illustrates a layer structure of LED, and a buffer layer 10a, a GaN layer 10b containing n-channel, the buffer layer 10a, the GaN layer containing p-channel, a light emitting layer 10d, and transparent conductive film 10e are layered on the silicon workpiece 10. The transparent conductive film 10e is ITO (Indium Tin Oxide) film. Note that the electrode is not illustrated in the figure. In addition, FIG. 5(B) illustrates the buffer layer 10a.

Firstly, pressure inside the chamber 20 is always reduced to predetermined pressure by exhaustion by the exhaustion unit 23 from the exhaustion port 21. Furthermore, the heater 34 starts heating together with the exhaustion. At the same time, the rotary table 31 starts rotating. The interior of the chamber 20 is heated by radiation from the rotating heater 34 (Step S01). Heating while exhaustion facilitates desorption of residual gas in the chamber 20, such as water molecules and oxygen molecules. By this, the residual gas less contaminates as impurities at the time of the film formation, and the crystallinity of the film is improved. After detecting that the oxygen concentration inside the chamber 20 became equal to or less than the predetermined value by a gas analysis apparatus such as Q-Mass, the rotary table 31 stops rotating.

The tray 11 loading the workpiece 10 is sequentially carried into the chamber 20 via the load lock 71, the gate valve GV2, the transfer chamber 70, and the gate valve GV1 by the transfer mean (Step S02). In Step S02, the rotary table 31 moves the empty holding region HA to transporting position from the transfer chamber 70. The holding regions HA each hold the tray 11 that was carried in by the transporting mean. Accordingly, the trays 11 on which the workpiece 10 is placed are placed on all holding regions HA in the rotary table 31.

When the rotary table 31 starts rotating again, the heater 34 heats the workpiece 10, and the oxide film on the surface of the workpiece 10 is removed by the surface processing unit 60 (Step S03). At this time, the absorption member 12 is heated by the heater 34, so that the absorption member emits electromagnetic wave with wavelength which can be easily absorbed by the workpiece 10, facilitating the heating of the workpiece 10 on the tray 11.

Furthermore, the workpiece 10 repeatedly passes through under the surface processing unit 60 by the rotation of the rotary table 31. The surface processing unit 60 introduces the processing gas G3 into the cylindrical electrode 61 from the processing gas introducer 65 and applies high-frequency voltage to the cylindrical electrode 61 from the RF power supply 66. The processing gas G3 is made into plasma by the application of high-frequency voltage, and the ions in the plasma hits the surface of the workpiece 10 passed through under the opening 61a, so that the oxide film is removed from the surface of the workpiece 10.

After the processing by the surface processing unit 60 is performed for the predetermined length of time for the oxide film is removed which is determined by experiments or the like, the buffer layer is formed by repeatedly and alternately performing the formation of the AlN film by the film formation unit 40B and the film processing unit 50 and the formation of the GaN film by the film formation unit 40A and the film processing unit 50. As described above, the target 42 formed of the material containing Ga and GaN is attached to the film formation unit 40A, and the target 42 formed of the material containing Al is attached to the film formation unit 40B.

Firstly, the Al film formation unit 40B and the film processing unit 50 form the AlN film on the workpiece 10 (Step S04). That is, the sputtering gas introducer 49 supplies the sputtering gas G1 into the processing space 41 of the film formation unit 40B through the gas inlet 47. The sputtering gas G1 is supplied around the target 42 formed of Al. The power supply 46 applies voltage to the target 42 of the film formation unit 40B. Accordingly, the sputtering gas G1 becomes plasma. The ions produced by the plasma bombards the target 42 and beats out sputtering particles containing Al.

Thin film which is the deposited sputtering particles containing Al atoms is formed on a surface of the unprocessed workpiece 10 when the workpiece 10 passes through the film formation unit 40B. In the present embodiment, the film is deposited at thickness that can include one or two Al atoms in the thickness direction each time the workpiece 10 passes through the film formation unit 40B.

The workpiece 10 that has passed through the film formation unit 40B by the rotation of the rotary table 31 passes through the film processing unit 50, and Al atoms of the thin film is nitrided in said process. That is, the processing gas introducer 58 supplies the sputtering gas G2 containing nitrogen gas through the gas inlet 56. The processing gas G2 containing nitrogen gas is supplied to the processing space 59 between the window 52 and the rotary table 31. The RF power supply 54 applies high-frequency voltage to the antenna 53.

The electric field generated by the antenna 53 through which high-frequency current has flown by the application of high-frequency voltage is generated in the processing space 59 via the window 52. Then, the electric field excites the processing gas G2 containing nitrogen gas supplied to the processing space 59 and produces plasma. The chemical species of nitrogen produced by the plasma bombards the Al thin film on the workpiece 10 and bonds with Al atoms, so that the AlN film that is sufficiently nitrided is formed.

The workpiece 10 on which the AlN film is formed passes through the film processing unit 50 by the rotation of the rotary table 31, goes to the surface processing unit 60, and the ions are irradiated on the AlN film in the surface processing unit 60 (Step S05). That is, the processing gas introducer 65 supplies the sputtering gas G3 containing argon gas through the piping. The processing gas G3 is supplied to the space in the cylindrical electrode 61 surrounded by the cylindrical electrode 61 and the rotary table 31. When voltage is applied from the RF power supply 66 to the cylindrical electrode 61, the cylindrical electrode 61 acts as an anode, and the chamber 20, the shield 62, the rotary table 31, and the tray 11 act as a cathode, exciting the processing gas G3 supplied in the space in the cylindrical electrode 61 and generating plasma. Furthermore, argon ions produced by plasma bombards the AlN film formed on the workpiece 10 and moves the particles to sparse area in the film to flatten the surface of the film.

In such a way, in the Steps S04 and S05, the film formation is performed by passing the workpiece 10 through the processing space 41 of the operating film formation unit 40B, and the nitriding process is performed by passing the workpiece 10 through the processing space 59 of the operating film processing unit 50. Furthermore, the workpiece 10 passes through the space in the cylindrical electrode 61 of the operating surface processing unit 60 to flatten the AlN film formed on the workpiece 10. Note that "operating" means that plasma generation operation to generate plasma is performed in respective processing spaces of the units 40, 50, and 60.

The rotary table 31 continues to rotate until the AlN film with predetermined thickness is formed on the workpiece 10, that is, until the predetermined time obtained in advance by, for example, simulation and experiment has elapsed. In other word, the workpiece 10 continues to circulate through the film formation unit 40 and the film processing unit 50 until the AlN film with predetermined thickness is formed. Note that it is preferable to determine the film formation speed, the nitriding speed, and the rotation speed (speed to pass through each unit) of the rotary table 31 so that the film formation and the nitriding are balanced, because it is preferable to perform nitriding each time Al is deposited at atomic thickness. For example, the rotary table 31 rotates at speed of 50 to 60 rpm.

After the predetermined time has elapsed (Step S06, Yes), firstly, the operation of the film formation unit 40B is stopped. In detail, the power supply 46 stops applying voltage to the target 42.

Next, the film formation unit 40A and the film processing unit 50 form the GaN film on the workpiece 10 (Step S07). Then, the GaN film is flattened (Step S08). That is, the sputtering gas G1 is supplied around the target 42 of the film formation unit 40A by the sputtering gas introducer 49 and voltage is applied to the target 42 of the film formation unit 40 by the power supply 46, to make plasma sputtering gas G1 supplied inside the processing space 41 of the film formation unit 40A into plasma. The ions produced by the plasma bombards the target 42 and beat out sputtering particles containing Ga atoms.

The workpiece 10 that has passed through the film formation unit 40a by the rotation of the rotary table 31 passes through the film processing unit 50, and Ga atoms of the thin film is nitrided in said process. That is, the processing gas introducer 58 supplies the processing gas G2 containing nitrogen gas through the gas inlet 56. The processing gas G2 containing nitrogen gas is supplied to the processing space 59 between the window 52 and the rotary table 31. The RF power supply 54 applies high-frequency voltage to the antenna 53.

The electric field generated by the antenna 53 through which high-frequency current has flown by the application of high-frequency voltage is generated in the processing space 59 via the window 52. Then, the electric field excites the processing gas G2 containing nitrogen gas supplied to the processing space 59 and produces plasma. The chemical species of nitrogen produced by the plasma bombards the GaN thin film on the workpiece 10 and bonds with Ga atoms, so that the GaN film that is sufficiently nitrided is formed.

The workpiece 10 on which the GaN film is formed passes through the film processing unit 50 by the rotation of the rotary table 31, goes to the surface processing unit 60, and the ions are irradiated on the GaN film in the surface processing unit 60 (Step S08). Ions produced by plasma bombards the GaN film formed on the workpiece 10 and moves the particles to sparse area in the film to flatten the surface of the film.

By this, thin film which is the deposited sputtering particles containing Ga atoms is formed on a surface of the AlN film. In the present embodiment, the film is deposited at thickness that can include one or two Ga atoms in the thickness direction each time the workpiece passes through the film formation unit 40.

In such a way, in the Steps S06 and S07, the film formation to form film containing Ga is performed by passing the workpiece 10 through the processing space 41 of the operating film formation unit 40A, and the nitriding process to form the GaN film is performed by passing the workpiece 10 through the processing space 59 of the operating film processing unit 50. Furthermore, the workpiece 10 passes through the space in the cylindrical electrode 61 of the operating surface processing unit 60 to flatten the GaN film formed on the workpiece 10.

When time for the GaN film with predetermined thickness to be formed on the work piece 10, which is the time determined by simulation and experiment, has elapsed, firstly, the rotary table 31 stops the operation of the film formation unit 40. That is, after the predetermined time has elapsed (Step S09, Yes), the operation of the film formation unit 40A is stopped. In detail, the power supply 46 stops to apply voltage to the target 42. Note that it is preferable to determine the film formation speed, the nitriding speed, and the rotation speed (speed to pass through each unit) of the rotary table 31 so that the film formation and the nitriding are balanced, because it is preferable to perform nitriding each time Ga is deposited at atomic thickness. For example, the rotary table 31 rotates at speed of 50 to 60 rpm.

The formation of the AlN film and the GaN film as described above is repeated until predetermined number of layers of the film are formed (Step S10, No). When predetermined number of layers of the film is formed (Step S10, Yes), the formation of the buffer layer is completed.

Furthermore, GaN layer is formed on the buffer layer (Step S11). This GaN layer is formed in the same way as the GaN layer in the above buffer layer. However, the film is formed for the time required to form GaN layer with predetermined thickness.

After the formation of the buffer layer and the GaN layer as described above, the operation of the film formation processing unit 40A is stopped, and then the operation of the film processing unit 50 is stopped, as described above (Step S12). In detail, the RF power supply 54 stops supplying high-frequency electric power to the antenna 53. Then, the rotation of the rotary table 31 is stopped, and the tray 11 on which the film-formed workpiece 10 is placed is carried into the cooling unit 80 via the transfer chamber 70 by the transporting mean, and is carried out from the load lock 71 after the workpiece 10 is cooled to the predetermined temperature (Step S13).

Note that, in the above description, the film processing unit 60 and the surface processing unit 60 continues to operate while forming the buffer layer (Steps S04 to S11), however, the film processing unit 50 and the surface processing unit 60 may be stopped every time each of the steps S04 to S11 is stopped. In this case, the operation of the film processing unit 50 is stopped after the operation of film formation unit 40B and the film formation unit 40A is stopped. As a result, the surface of the film formed on the workpiece 10 can be sufficiently nitrided, and GaN film and AlN film without nitrogen deficiency can be obtained.

[Effect]

(1) The film formation apparatus 1 of the present embodiment includes: the chamber 20 which an interior thereof can be made vacuum; the rotary table 31 provided inside the chamber, holding the plurality of the workpieces 10, and circulating and transporting the workpiece 10 in a circular trajectory; the film formation unit 40 including the target 42 formed of film formation material and the plasma generator which turns sputtering gas introduced between the target and the rotary table 31 into plasma, the film formation unit 40 depositing by sputtering the film formation material on the workpiece 10 circulated and transported by the rotary table 31; the film processing unit 50 processing the film deposited by the film formation unit 40 on the workpiece 10 circulated and transported by the rotary table 31; the plurality of the holding regions HA each holding the workpiece 10 and provided in the circular film formation region FA facing the film formation unit 40 and the film processing unit 50 that is a region other than the rotation axis 311 in the rotary table 31, and the heater 34 provided in the plurality of the holding regions HA.

Conventionally, when the heat source is fixed and arranged distantly from the rotary table, the temperature of the workpiece that is heated is not stable, because time to heat the workpiece that is rotated is limited. By this, it is difficult to heat to and keep the desired temperature. However, since the present embodiment includes the heater 34 in each holding region HA in the rotary table 31, the heater 34 can rotate together with the workpiece 10 and heat the workpiece 10 that is rotated. By this, the temperature of the workpiece 10 will not decrease, and the workpiece 10 can be heated and kept at the desired temperature.

Furthermore, since the heater 34 provided in each holding region HA in the rotary table 31 heats the workpiece 10 held by the holding region HA, the heating temperature of the heater 34 need not be excessively high compared with the case in which the workpiece 10 is heated only by radiation heat from the distant rotary table 31, so that efficient heading is achieved.

(2) The heat insulator 33 is provided between the heater 34 and the rotary table 31. Therefore, since the transmission of heat from the heater 34 to the rotary table 31 is suppressed, the thermal deformation which harms the flatness of the rotary table 31 can be prevented.

For example, since the rotary table 31 moves the workpiece 10 to pass through under the film formation unit 40, the film processing unit 50, and the surface processing unit 60, the rotary table 31 has a disc-shape with large diameter and is made of metal to achieve strength and heat resistance by relatively low cost. Then, when the rotary table 31 is heated, the rotary table 31 may be thermally deformed, losing its flatness. In particular, if drastic change in temperature, such as from normal temperature to about 600 degrees, occur, the rotary table 31 plastically deforms and will not return the original state and loses its flatness even after cooling. If the flatness is lost, size of the gap between the workpiece 10 on the rotary table 31 and the divider 22 provided in the film formation unit 40, the film processing unit 50, and the surface processing unit 60 changes, and the pressure in the film formation unit 40, the film processing unit 50, and the surface processing unit 60 cannot be kept constant, which makes the plasma discharge in each processing space unstable. Furthermore, in the film formation unit 40, since the positional relationship between the target 42 and the workpiece 10 on the rotary table 31 changes from the predetermined distance, the desired film formation rate may not be achieved or the film thickness may be non-uniform. In addition, since the height position and horizontal position of the holding region HA change because the flatness of the rotary table 31 is lost, the workpiece 10 may be displaced relative to or may hit the rotary table 31 when transferring the workpiece 10 from the transfer chamber 70 to the holding region HA by the transporting mean even if the workpiece 10 is transferred at the predetermined position.

On the other hand, it is not realistic to form all of the rotary table 31 by heat insulator such as ceramics in view of cost. Therefore, the heat insulator 33 is provided between the rotary table 31 and the heater 34 to insulate heat from the rotary table 31, suppressing cost and the heating of the rotary table 31 other than the holding region HA.

(3) The rotary connection 35 to enable power supply to the heater 34 rotating and moving by the rotary table 31 is provided in the rotary shaft 311. Therefore, electrical power can be supplied to each heater 34 moving in a trajectory of circle using simple structures.

(4) The heater 34 can control the temperature so that the temperature of the workpiece 10 rises by stages to the target temperature. By this, the workpiece 10 is prevented from being damaged due to the rapid increase in temperature. For example, after all the workpieces 10 is set on the rotary table 31, the temperature is gradually increased, that is, the heater 34 is controlled to gradually increase the temperature, so that the workpiece 10 is prevented from being damaged due to the rapid increase in temperature. Furthermore, since the polarity of the Ga changed depending on the temperature, crystal phase of the film (Ga) formed on the workpiece 10 can be changed by adjusting the temperature of the heater 34. Note that a plurality of the heater 34 is provided corresponding to each region holding the workpiece 10 in the plurality of the holding regions HA, and the temperature of the plurality of the heaters 34 can be individually adjusted. Therefore, the workpiece 10 that is the processing target can be heated by appropriate temperature according to the types, size, and the like.

(5) The heat shield 36 is arranged along the film formation region FA distantly from the rotary table 31 at a side opposite the film formation region FA which is facing each processing unit of the rotary table 31. Therefore, the heating of the chamber 20 by radiation from the heater 34 is suppressed. Since the heat absorption of the inner wall of the chamber 20 is suppressed, deformation of the wall surface of the chamber 20, and damages to the bearing of the rotary shaft 311 and the sealing member caused by heating can be prevented.

(6) The workpiece 10 is held by the rotary table 31 via the tray 11, and the absorption member 12 which absorbs the heat from the heater 34 and generates electromagnetic wave is provided between the tray 11 and the workpiece 10. Therefore, the workpiece 10 can be efficiently heated by the electromagnetic wave generated from the absorption member 12. For example, the workpiece 10 can be efficiently heated even when the workpiece 10 is sapphire substrates or glass substrates, because the absorption member 12 generates electromagnetic wave that can be absorbed.

(7) The film formation apparatus 1 includes the surface processing unit 60 processing at least one of the surface of the workpiece and the surface of the film circulated and transported by the rotary table 31. Therefore, the adhesion of the surface of the workpiece 10 and the surface of the film is improved. For example, if oxide film is on the workpiece 10, the film deposited on the oxide film easily peel off. If the surface of the film is uneven, the adhesion of the film deposited thereon is reduced. Therefore, the adhesion of the film can be improved by removing the oxide film on the surface of the workpiece 10 by the surface processing unit 60 and flattening the surface of the film. Since the surface of the workpieces 10 can be processed in the chamber 20 at once in advance, the throughput is improved than the case in which the surface is processed separately outside the chamber 20. Furthermore, since the heating by the heater 34 and the surface processing can be performed at the same time, the overall processing time can be reduced.

Modified Example

Note that the present disclosure is not limited to the following examples. Modified examples such as in below can be implemented with the similar basic configuration as the above embodiment.

Figure 5:
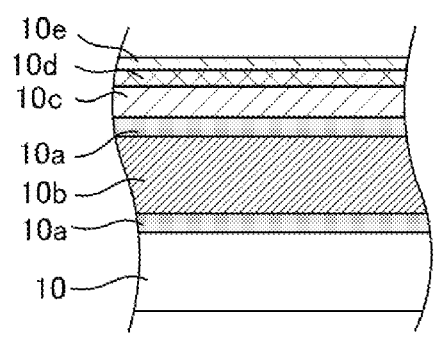
FIG. 5(A) is a cross sectional diagram illustrating an example of a LED layer structure.
FIG. 5(B) is an enlarged view of a buffer layer.
Figure 5:
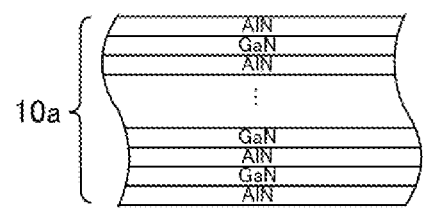

(1) Although the surface processing unit 60 is provided inside the chamber 20 in the above aspect, as illustrated in FIG. 5, a surface processing unit 60S may be arranged outside the chamber 20. The surface processing unit 60S includes the cylindrical electrode 61, the RF power supply 66, and the processing gas introducer 65, like the surface processing unit 60, and performs oxide film removing process in the static condition on the transported workpiece 10. In this aspect, the oxide film removing process can be performed on the workpiece 10 waiting outside the chamber during the film formation process on the workpiece 10 inside the chamber 20, so that the processing time in the chamber 20 can be reduced.

(2) The shape and number of the heat shielding plate 36a are not limited to the above embodiment. Although the heat shield 36 is arranged to distantly cover the lower surface of the rotary table 31, the annular heat shielding plate 36a with U-shaped cross-section may be layered to cover a position in the lower surface of the eotary table 31 corresponding to the holding region HA. Furthermore, although the example heat shielding plate 36a has the shape formed by a side plate and a flat plate, the heat shielding effect can be achieved even when the heat shielding plate is formed only by a flat plate.

(3) In the above embodiment, a plurality of the heaters 34 is arranged, and respective ring electrodes 351a are connected to the heaters 34 via the cables 351b. One or a plurality of the heaters 34 may be connected to one ring electrode 351a. For example, when connecting the plurality of the heaters 34 to one ring electrode 351a, the heaters 34 are electrically connected with each other, and the representative one heater 34 is connected to the ring electrode 351a via the cable 351b. By this, the number of the ring electrodes 351 can be less than the number of the heaters 34, and the length of the rotary electrode 351 can be shorter. As a result, the rotary shaft 311 in which the rotary electrode 351 is arranged can be shorter, and the installation space for the apparatus can be reduced, and the rotation of the rotary table 31 can be stabilized.

(4) The types and numbers of the film formation processing unit 40 and the types and numbers of the film processing unit 50 and the surface processing unit 60 provided in the chamber 20 are not limited to the above aspects. The number of the film formation unit 40 may be one or more than three. A plurality of the film processing unit 50 and the surface processing unit 60 may be provided. For example, the film formation unit 40 may only include the film formation unit 40A to form the film formation apparatus 1 forming GaN film. Furthermore, in addition to the above film formation unit 40, the film formation unit 40 with different target material may be provided, the film formation unit 40 with the same material target may be provided, and the film processing unit 50 may be provided.

Figure 6:
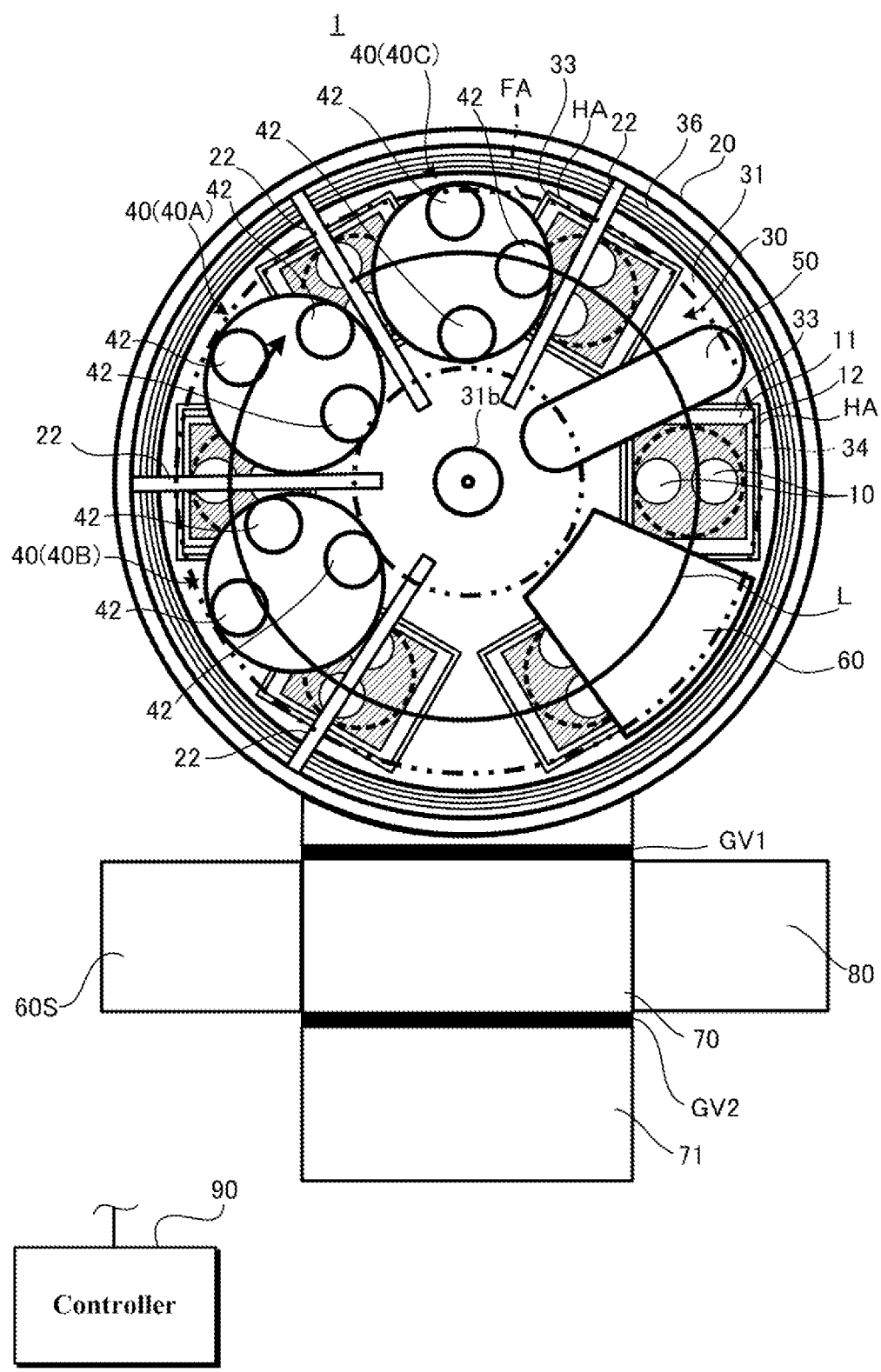
FIG. 6 is a transparent plan view schematically illustrating a modified example of the embodiment.

Furthermore, for example, as illustrated in FIG. 6, the film formation unit 40C including a target 42 containing indium oxide and tin oxide that is the film formation material of ITO may be added to form ITO film in the chamber 20. In this case, in the film processing unit 50, oxygen gas may be introduced instead of nitrogen gas to supplement the oxidation of the ITO film. In addition, for example, the film formation unit 40A, the film formation unit 40B, and the film processing unit 50 may be operated at the same time to form AlGaN (Aluminum Gallium Nitride) film that contains Ga, Al, and N. As illustrated in FIG. 5(A), the AlGaN film acts as a light emitting layer 10d of LED. That is, the light emitting layer 10d may be formed in the chamber 20.

(5) The film formation unit 40 may include a film formation unit depositing film formation particles containing gallium oxide ($Ga_2O_3$), and the film processing unit 50 may include a oxidation processing unit to oxidize the film formation particles deposited in the film formation unit. That is, the film formation unit using material containing Ga atoms and oxygen (O) as the target may be provided instead of or in addition to the above film formation unit 40A, and the oxidation processing unit using gas containing oxygen as the processing gas G2 may be provided instead of or in addition to the nitriding processing unit.

(6) In addition to the above aspects, a film formation unit including a target 42 formed of film formation material containing InN may be provided as the film formation processing unit 40. Since indium (In) alone has low melting point, in practice, an InN target to which nitrogen is added is used as the solid target 42. Similarly to the above, the InN target contains In atoms lacking bonds with nitrogen.

(7) In addition to the above aspect, an impurity addition processing unit to add n-type or p-type impurities (dopant) to the formed GaN film may be provided. In this case, the film formation unit, the nitriding processing unit, and the impurity addition processing unit are arranged in line in this order along the circulation and transportation path. The impurity addition processing unit includes the same configuration as the film formation unit 40.

In such aspects, a layer containing a p-channel (p-type semiconductor) to which Mg ions are added to the GaN layer can be formed by operating the impurity addition processing unit together with the film formation unit 40A and the film processing unit 50 during the formation of the GaN film. Furthermore, a layer containing a n-channel (p-type semiconductor) to which Si ions are added to the GaN layer can be formed by operating the impurity addition processing unit together with the film formation unit 40A and the film processing unit 50 during the formation of the GaN film.

The n-type impurity and the p-type impurity added in the impurity addition processing unit are not limited to the above embodiments. For example, the n-type impurity may be Ge or Sn. In this case, the film formation material forming the target provided in the impurity addition processing unit may be film formation material containing Ge and Sn instead of Si.

Other Embodiment

Although the modified examples of the embodiments and portions according to the present disclosure are described, these modified examples of the embodiments and portions are only presented as examples and are not intended to limit the scope of the claims. These new embodiments described above can be implemented in other various forms, and various omission, replacement, modification, and changes may be made without departing from the abstract of the invention. These embodiments and modification thereof are included in the scope and abstract of the invention, and are included in the invention described in the scope of the claims.

REFERENCE SIGN

1: film formation apparatus
10: workpiece
10a: buffer layer
10b, 10c: GaN layer
10d: light emitting layer
10e: transparent conductive film
11: tray
12: absorption member
20: chamber
20a: ceiling
20b: bottom
20c: side surface
20d: through hole
20e: fastening member
21: exhaustion port
21a: opening
22: divider
23: exhaustion unit
30: transporting unit
31: rotary table
31a: through hole
31b: fastening member
32: motor
33: heat insulator
34: heater
35: rotary connection
36: heat shield
36a: heat shielding plate
36b: support leg
40, 40A, 40B, 40C: film formation unit
41: processing space
42: target
43: backing plate
44: electrode
46: power supply
47: gas inlet
48: piping
49: sputtering gas introducer
50: film processing unit
51: cylinder body
52: window
53: antenna
54: RF power supply
55: matching box
56: gas inlet
57: piping
58: processing gas introducer
59: processing space
60, 60S: surface processing unit
61: cylindrical electrode
61a: opening
61b: flange
61c: insulation member
61d: housing
62: shield
64: processing space
65: processing gas introducer
66: RF power supply
67: matching box
70: transfer chamber
71: load lock
80: cooling chamber
90: controller
311: rotary shaft
311a: central hole
311b: plate
351: rotary electrode
351a: ring electrode
351b: cable
352: static electrode
352a: brush electrode
352b: cable
353: controller

What is claimed is:

1. A film formation apparatus comprising:
a chamber which an interior thereof can be made vacuum;
a rotary table provided inside the chamber, holding a workpiece, and circulating and transporting the workpiece in a circular trajectory;
a film formation unit including a target formed of film formation material containing and a plasma generator which turns sputtering gas introduced between the target and the rotary table into plasma, wherein the film formation unit deposits by sputtering particles of the film formation material on the workpiece circulated and transported by the rotary table; and
a film processing unit processing the film deposited on the workpiece in the film formation unit circulated and transported by the rotary table in the film formation unit,
wherein the rotary table comprises
a plurality of holding regions which holds each workpiece and which is provided in a film formation region that is an annular region in the rotary table other than a rotary shaft facing the film formation unit and the film processing unit, a heater arranged between the rotary table and the workpiece in each of the plurality of the holding regions to heat the workpiece on each of the plurality of the holding regions, and a heat insulator arranged between the rotary table and the heater in at least one of the plurality of holding regions.

2. The film formation apparatus according to claim 1, wherein the heater can control temperature so that temperature of the workpiece rises by stages to target temperature.

3. The film formation apparatus according to claim 1, further comprising a heat shield arranged along the film formation region distantly from the rotary table at a side opposite the film formation region facing each processing unit of the rotary table, wherein the heat shield comprises
a plurality of heat shielding plates being a flat ring-shaped plate and arranged as stacked layers with vertical spaces, and
a support leg supporting and fixing the plurality of the heat shielding plates to a bottom of the chamber.

4. The film formation apparatus according to claim 1, wherein the workpiece is held by the rotary table via a tray, the film formation apparatus further comprising an absorption member which absorbs heat from the heater and generates electromagnetic wave is provided between the tray and the workpiece.

5. The film formation apparatus according to claim 1, wherein the film processing unit performs chemical reaction processing on the film formed by the film formation unit,
wherein the film formation apparatus further comprises a surface processing unit drawing and irradiating ion on at least one of the surface of the workpiece and the surface of the film circulated and transported by the rotary table.

6. The film formation apparatus according to claim 1, wherein:
the film formation unit includes a GaN film formation unit depositing particles of the film formation material containing GaN, and
the film processing unit includes a nitriding processing unit nitriding the particles of the film formation material deposited in the GaN film formation processing unit.

7. The film formation apparatus according to claim 5, wherein the film processing unit further comprises:
a cylinder body fit in a ceiling of the chamber so that a first opening thereof faces the rotary-table side with distance, and protruded into an interior space of the chamber,
a window provided to block the first opening of the cylinder body,
an antenna being a conductor wound in a coil-shape, arranged in an interior space of the cylinder body being separated from a processing space in the chamber by the window, and generating electric field when AC current is applied, and
a first processing gas introducer introducing a first processing gas into the processing space, wherein the surface processing unit further comprises:
a cylindrical electrode having a square cylinder wherein one end has a second opening, the other blocked end of the cylindrical electrode is attached to the third opening provided in the ceiling of the chamber via an insulation member so that the one end with the second opening faces the rotary table,
a shield covering a side wall of the cylindrical electrode located inside the chamber,
a second processing gas introducer introducing a second processing gas into the cylindrical electrode, and
an RF power supply applying high-frequency voltage to the cylindrical electrode,
wherein the RF power supply applies the high-frequency voltage to the cylindrical electrode, so that a desired negative bias voltage is applied to the rotary table, and ions are drawn to the workpiece.

8. The film formation apparatus according to claim 7, wherein:
the film formation unit includes a GaN film formation unit depositing particles of the film formation material containing GaN, and
the film processing unit includes a nitriding processing unit nitriding the particles of the film formation material deposited in the GaN film formation processing unit.

9. The film formation apparatus according to claim 8, wherein the film processing unit, the nitriding processing unit, and the surface processing unit are arranged in this order on a path for circulating and transporting the workpiece.

10. The film formation apparatus according to claim 1, further comprising a rotary connector electrically connecting the heater and a power supply,
wherein the rotary connector comprises
a plurality of conductive ring electrodes arranged coaxially on the rotary shaft outside the chamber and rotating with the rotary shaft, and
a static electrode comprising a plurality of conductive brush electrodes fixed separately from the rotary shaft at a position in contact with the ring electrode.

11. The film formation apparatus according to claim 10, wherein the rotary shaft is cylindrical,
wherein the rotary shaft further comprises:
a circular plate airtightly covering a central hole that is an opened end of the rotary shaft, and
a cable passing through a hole provided outside the chamber in the rotary shaft and airtightly passing through a center of the circular plate from inside the rotary shaft,
wherein the cable passes through a hole provided in the rotary table and is connected to the heating unit from a rear side of the rotary table.

12. The film formation apparatus according to claim 3, wherein the heat shield is a metal component with L-shaped cross-section comprising a cylindrical side plate standing straight from an outer edge of a flat plate, and
a transport port is formed in the cylindrical side plate by cutting out a part thereof corresponding to a load lock to carry in the workpiece to the rotary table.

* * * * *